US012089395B2

(12) United States Patent
Sato et al.

(10) Patent No.: US 12,089,395 B2
(45) Date of Patent: *Sep. 10, 2024

(54) SEMICONDUCTOR DEVICE AND SEMICONDUCTOR MEMORY DEVICE

(71) Applicant: Kioxia Corporation, Tokyo (JP)

(72) Inventors: Yuta Sato, Yokohama Kanagawa (JP); Tomomasa Ueda, Yokohama Kanagawa (JP); Nobuyoshi Saito, Ota Tokyo (JP); Keiji Ikeda, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 282 days.

This patent is subject to a terminal disclaimer.

(21) Appl. No.: 17/470,871

(22) Filed: Sep. 9, 2021

(65) Prior Publication Data
US 2022/0302120 A1    Sep. 22, 2022

(30) Foreign Application Priority Data
Mar. 22, 2021    (JP) .................................. 2021-047614

(51) Int. Cl.
  *H10B 12/00* (2023.01)
  *H01L 29/24* (2006.01)
  *H01L 29/786* (2006.01)

(52) U.S. Cl.
  CPC ............. *H10B 12/30* (2023.02); *H01L 29/24* (2013.01); *H01L 29/78618* (2013.01); *H01L 29/78642* (2013.01); *H01L 29/7869* (2013.01)

(58) Field of Classification Search
  CPC .............. H10B 12/30; H01L 29/78642; H01L 29/7869
  See application file for complete search history.

(56) References Cited

U.S. PATENT DOCUMENTS

| 9,698,272 B1 * | 7/2017 | Ikeda ................ H01L 29/78642 |
| 11,094,697 B2 * | 8/2021 | Yang ....................... H01L 28/90 |
| 11,094,698 B2 * | 8/2021 | Inaba ..................... H10B 12/20 |
| 11,430,886 B2 * | 8/2022 | Sato ........................ H01L 29/24 |

(Continued)

FOREIGN PATENT DOCUMENTS

| JP | 2010-056539 A | 3/2010 |
| JP | 2013-118367 A | 6/2013 |

(Continued)

*Primary Examiner* — Vincent Wall
(74) *Attorney, Agent, or Firm* — Foley & Lardner LLP

(57) ABSTRACT

A semiconductor device of an embodiment is provided with: an oxide semiconductor layer including a first region, a second region, and a third region between the first region and the second region; a gate electrode; a gate insulating layer; a first electrode electrically connected to the first region; a second electrode electrically connected to the second region; a first conductive layer provided at least one of positions between the first region and the first electrode or between the second region and the second electrode and containing a first metal element and at least one element of oxygen (O) or nitrogen (N); and a second conductive layer provided between the oxide semiconductor layer and the first conductive layer and containing oxygen (O) and at least one element selected from indium (In), zinc (Zn), tin (Sn), or cadmium (Cd). The second conductive layer is thicker than the first conductive layer.

21 Claims, 9 Drawing Sheets

(56) References Cited

U.S. PATENT DOCUMENTS

| | | | |
|---|---|---|---|
| 11,488,981 B2* | 11/2022 | Lee | H01L 29/42392 |
| 2008/0251825 A1* | 10/2008 | Lee | H01L 29/42392 |
| | | | 257/E29.264 |
| 2010/0025678 A1 | 2/2010 | Yamazaki et al. | |
| 2013/0168671 A1 | 7/2013 | Koike et al. | |
| 2014/0021485 A1* | 1/2014 | Cho | H10B 12/05 |
| | | | 257/77 |
| 2014/0183529 A1 | 7/2014 | Yamazaki | |
| 2014/0374908 A1 | 12/2014 | Koezuka et al. | |
| 2015/0076495 A1* | 3/2015 | Miyairi | H01L 29/78642 |
| | | | 257/43 |
| 2017/0194502 A1 | 7/2017 | Baeck | |
| 2019/0067437 A1* | 2/2019 | Ramaswamy | H01L 29/45 |
| 2019/0237581 A1 | 8/2019 | Saito et al. | |
| 2019/0348540 A1* | 11/2019 | Pillarisetty | H01L 21/823475 |
| 2020/0058798 A1* | 2/2020 | Pillarisetty | H01L 29/4232 |
| 2020/0381557 A1 | 12/2020 | Hattori et al. | |
| 2022/0302120 A1* | 9/2022 | Sato | H10B 12/30 |

FOREIGN PATENT DOCUMENTS

| | | |
|---|---|---|
| JP | 2014-239216 A | 12/2014 |
| JP | 2015-026831 A | 2/2015 |
| JP | 2017-168623 A | 9/2017 |
| JP | 2018-191014 A | 11/2018 |
| JP | 2019-134077 A | 8/2019 |
| JP | 2020-021949 A | 2/2020 |
| JP | 2020-198343 A | 12/2020 |
| WO | WO-2012/002573 A1 | 1/2012 |

* cited by examiner though in claim-like language.

SEMICONDUCTOR DEVICE AND SEMICONDUCTOR MEMORY DEVICE

CROSS-REFERENCE TO RELATED APPLICATION

This application is based upon and claims the benefit of priority from Japanese Patent Application No. 2021-047614, filed on Mar. 22, 2021, the entire contents of which are incorporated herein by reference.

FIELD

Embodiments described herein relate generally to a semiconductor device and a semiconductor memory device.

BACKGROUND

An oxide semiconductor transistor forming a channel in an oxide semiconductor layer has an excellent characteristic that a channel leakage current during an off-operation is extremely small. For this reason, for example, the application of the oxide semiconductor transistor to a switching transistor of a memory cell of dynamic random-access memory (DRAM) has been studied.

For example, when the oxide semiconductor transistor is applied to the switching transistor of the memory cell, the oxide semiconductor transistor undergoes heat treatment accompanying the formation of the memory cell and wiring. It has thus been expected to realize an oxide semiconductor transistor having high heat resistance with little fluctuation in characteristics even after heat treatment.

DETAILED DESCRIPTION

Figure 1:
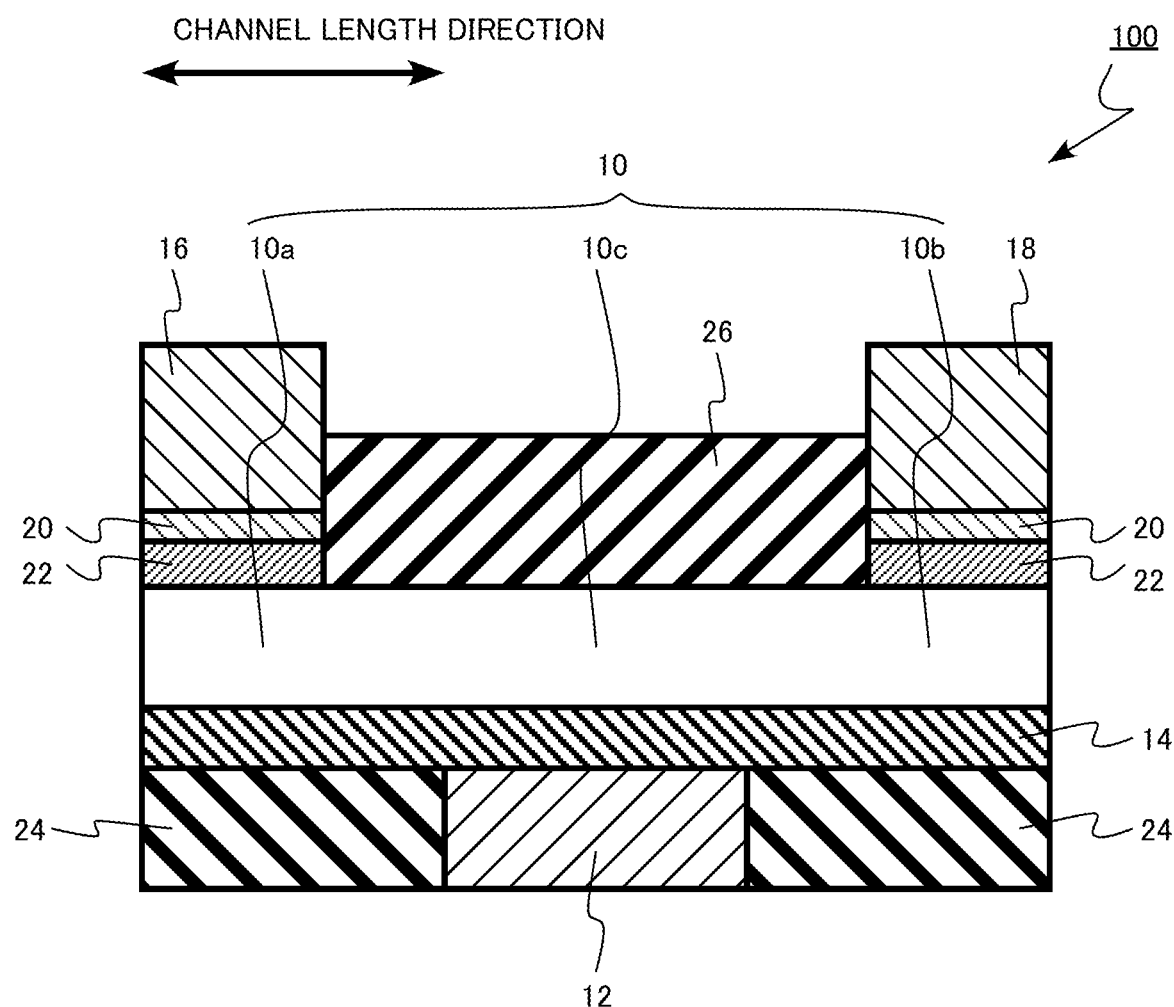
FIG. 1 is a schematic sectional view of a semiconductor device according to a first embodiment.

A semiconductor device of an embodiment is provided with: an oxide semiconductor layer including a first region, a second region, and a third region provided between the first region and the second region; a gate electrode; a gate insulating layer provided between the third region and the gate electrode; a first electrode electrically connected to the first region; a second electrode electrically connected to the second region; a first conductive layer provided in at least one of positions between the first region and the first electrode or between the second region and the second electrode, and the first conductive layer containing a first metal element and at least one element of oxygen (O) or nitrogen (N); and a second conductive layer provided between the oxide semiconductor layer and the first conductive layer, the second conductive layer containing oxygen (O) and at least one element selected from the group consisting of indium (In), zinc (Zn), tin (Sn), and cadmium (Cd), and the second conductive layer having a thickness in a first direction from the first conductive layer to the second conductive layer, which is larger than a thickness in the first direction of the first conductive layer.

Embodiments of the present disclosure will be described below with reference to the drawings. In the following description, the same or similar members or the like are denoted by the same reference numerals, and the description of the once described member or the like is omitted appropriately.

In the present specification, the term "above" or "below" may be used for convenience. The term "above" or "below" is merely a term indicating a relative positional relationship in the drawing and is not a term defining a positional relationship with respect to gravity.

The qualitative analysis and quantitative analysis of the chemical composition of the members constituting the semiconductor device and the semiconductor memory device described in the present specification can be performed by, for example, secondary Ion mass spectrometry (SIMS), energy-dispersive X-ray spectroscopy (EDX), and Rutherford backscattering spectroscopy (RBS). A transmission electron microscope (TEM), for example, can be used for measuring the thickness of each of the members constituting the semiconductor device, the distance between members, the crystal grain size, and the like.

First Embodiment

A semiconductor device of a first embodiment is provided with: an oxide semiconductor layer including a first region, a second region, and a third region provided between the first region and the second region; a gate electrode; a gate insulating layer provided between the third region and the gate electrode; a first electrode electrically connected to the first region; a second electrode electrically connected to the second region; a first conductive layer provided at least one of positions between the first region and the first electrode or between the second region and the second electrode, and the first conductive layer containing a first metal element and at least one element of oxygen (O) or nitrogen (N); and a second conductive layer provided between the oxide semiconductor layer and the first conductive layer, the second conductive layer containing oxygen (O) and at least one element selected from the group consisting of indium (In), zinc (Zn), tin (Sn), and cadmium (Cd), and the second conductive layer having a thickness larger than a thickness of the first conductive layer.

FIG. 1 is a schematic sectional view of the semiconductor device of the first embodiment.

The semiconductor device of the first embodiment is a transistor 100. The transistor 100 is an oxide semiconductor transistor in which a channel is formed in an oxide semiconductor layer. The transistor 100 is a so-called bottom gate type transistor having a gate electrode provided below the oxide semiconductor layer in which the channel is formed, and having a source electrode and a drain electrode provided above the oxide semiconductor layer. The transistor 100 is an n-channel transistor using electrons as carriers.

The transistor 100 includes an oxide semiconductor layer 10, a gate electrode 12, a gate insulating layer 14, a source electrode 16, a drain electrode 18, a barrier layer 20, a contact layer 22, a first insulating layer 24, and a second insulating layer 26.

The source electrode 16 is an example of the first electrode. The drain electrode 18 is an example of the second electrode. The barrier layer 20 is an example of the first conductive layer. The contact layer 22 is an example of the second conductive layer.

A channel serving as a current path is formed in the oxide semiconductor layer 10 when the transistor 100 is turned on. A direction in which electrons flow in the channel is called a channel length direction. The channel length direction is indicated by a double-headed arrow in FIG. 1.

The oxide semiconductor layer 10 is an oxide semiconductor. The oxide semiconductor layer 10 is a metal oxide. The oxide semiconductor layer 10 is amorphous, for example.

The oxide semiconductor layer 10 contains, for example, indium (In), zinc (Zn), and at least one element of gallium (Ga) and aluminum (Al). The ratio of the sum of the atomic concentrations of indium, gallium, aluminum, and zinc to the sum of the atomic concentrations of the metal elements contained in the oxide semiconductor layer 10 is, for example, 90% or more. The ratio of the sum of the atomic concentrations of indium, gallium, aluminum, and zinc to the sum of the atomic concentrations of elements except for oxygen contained in the oxide semiconductor layer 10 is, for example, 90% or more. For example, in the oxide semiconductor layer 10, there is no element except for oxygen having an atomic concentration higher than any one of indium, gallium, aluminum, and zinc.

The atomic concentration of zinc (Zn) contained in the oxide semiconductor layer 10 is, for example, 5 atom % or more and 20 atom % or less.

The oxide semiconductor layer 10 has a first region 10a, a second region 10b, and a third region 10c. The third region 10c is provided between the first region 10a and the second region 10b.

The oxide semiconductor layer 10 includes, for example, oxygen deficiency. The oxygen deficiency in the oxide semiconductor layer 10 functions as a donor.

The thickness of the oxide semiconductor layer 10 is, for example, 10 nm or more and 100 nm or less.

The oxide semiconductor layer 10 is formed by, for example, an atomic layer deposition method (ALD method).

The gate electrode 12 is provided below the oxide semiconductor layer 10. The gate electrode 12 is, for example, a metal, a metal compound, or a semiconductor. The gate electrode 12 is made of, for example, titanium nitride (TiN) or tungsten (W). The gate length of the gate electrode 12 is, for example, 20 nm or more and 100 nm or less. The gate length of the gate electrode 12 is the length of the gate electrode 12 in the channel length direction.

The gate insulating layer 14 is provided between the oxide semiconductor layer 10 and the gate electrode 12. The gate insulating layer 14 is provided between the third region 10c and the gate electrode 12.

The gate insulating layer 14 is, for example, an oxide or oxynitride. The gate insulating layer 14 is, for example, silicon oxide or aluminum oxide. The thickness of the gate insulating layer 14 is, for example, 2 nm or more and 10 nm or less.

An oxide layer (not illustrated) of a material different from that of the gate insulating layer 14 may be provided between the oxide semiconductor layer 10 and the gate insulating layer 14.

The source electrode 16 is provided above the oxide semiconductor layer 10. The oxide semiconductor layer 10 is sandwiched between the gate electrode 12 and the source electrode 16.

The source electrode 16 is provided above the first region 10a. The source electrode 16 is electrically connected to the first region 10a.

The source electrode 16 is, for example, a metal or a metal compound. The source electrode 16 is, for example, a metal having a chemical composition different from that of the barrier layer 20.

The source electrode 16 contains, for example, a second metal element. For example, the atomic concentration of the second metal element is the highest among the atomic concentrations of the metal elements contained in the source electrode 16.

The second metal element is, for example, at least one element selected from the group consisting of titanium (Ti), tungsten (W), copper (Cu), aluminum (Al), tantalum (Ta), and molybdenum (Mo).

The source electrode 16 is, for example, titanium, titanium nitride, tungsten, tungsten nitride, copper, aluminum, tantalum, tantalum nitride, molybdenum, or molybdenum nitride.

The second metal element contained in the source electrode 16 is, for example, the same as the first metal element contained in the barrier layer 20. In addition, the second metal element contained in the source electrode 16 is, for example, different from the first metal element contained in the barrier layer 20.

The thickness of the source electrode 16 is larger than the thickness of the contact layer 22, for example. The thickness of the source electrode 16 and the thickness of the contact layer 22 are thicknesses in a direction from the oxide semiconductor layer 10 toward the source electrode 16.

The drain electrode 18 is provided above the oxide semiconductor layer 10. The oxide semiconductor layer 10 is sandwiched between the gate electrode 12 and the drain electrode 18.

The drain electrode 18 is provided above the second region 10b. The drain electrode 18 is electrically connected to the second region 10b.

The drain electrode 18 contains, for example, a second metal element. For example, the atomic concentration of the second metal element is the highest among the atomic concentrations of the metal elements contained in the drain electrode 18.

The second metal element is, for example, at least one metal element selected from the group consisting of titanium (Ti), tungsten (W), copper (Cu), aluminum (Al), tantalum (Ta), and molybdenum (Mo).

The drain electrode 18 is, for example, titanium, titanium nitride, tungsten, tungsten nitride, copper, aluminum, tantalum, tantalum nitride, molybdenum, or molybdenum nitride.

The second metal element contained in the drain electrode 18 is, for example, the same as the first metal element contained in the barrier layer 20. The second metal element contained in the drain electrode 18 is, for example, different from the first metal element contained in the barrier layer 20.

The thickness of the drain electrode 18 is larger than the thickness of the contact layer 22, for example. The thickness of the drain electrode 18 and the thickness of the contact layer 22 are thicknesses in a direction from the oxide semiconductor layer 10 toward the drain electrode 18.

The barrier layer 20 is provided between the oxide semiconductor layer 10 and the source electrode 16. The barrier layer 20 is provided between the first region 10a and the source electrode 16. The barrier layer 20 is in contact with, for example, the source electrode 16. The barrier layer 20 functions as a diffusion barrier for oxygen diffused from the oxide semiconductor layer 10 toward the source electrode 16.

The barrier layer 20 is provided between the oxide semiconductor layer 10 and the drain electrode 18. The barrier layer 20 is provided between the second region 10b and the drain electrode 18. The barrier layer 20 is in contact with, for example, the drain electrode 18. The barrier layer 20 functions as a diffusion barrier for oxygen diffused from the oxide semiconductor layer 10 toward the drain electrode 18.

The barrier layer 20 contains a first metal element and at least one element of oxygen (O) and nitrogen (N). For example, the atomic concentration of the first metal element is the highest among the atomic concentrations of elements except for oxygen (O) and nitrogen (N) contained in the barrier layer 20.

The first metal element is, for example, at least one element selected from the group consisting of titanium (Ti), tungsten (W), copper (Cu), aluminum (Al), tantalum (Ta), and molybdenum (Mo).

The barrier layer 20 is, for example, an oxide, a nitride, or an oxynitride.

The barrier layer 20 contains, for example, titanium (Ti) as the first metal element. The barrier layer 20 contains, for example, oxygen (O) and nitrogen (N). The barrier layer 20 is, for example, titanium oxide or titanium oxynitride.

The thickness of the barrier layer 20 is, for example, smaller than the thickness of the contact layer 22. The thickness of the barrier layer 20 and the thickness of the contact layer 22 are thicknesses in a direction from the oxide semiconductor layer 10 toward the source electrode 16.

The thickness of the barrier layer 20 is, for example, one-half or less of the thickness of the contact layer 22. The thickness of the barrier layer 20 is, for example, 1 nm or more and 10 nm or less.

The barrier layer 20 is, for example, crystalline. The crystal grain size of the barrier layer 20 is, for example, smaller than the crystal grain size of the contact layer 22. The crystal grain size of the barrier layer 20 and the contact layer 22 is represented by, for example, the median value of the major axis of the crystal grain.

The barrier layer 20 is, for example, amorphous.

The barrier layer 20 is formed by, for example, a sputtering method or an ALD method. The barrier layer 20 is formed by, for example, oxidization, nitriding, or oxynitriding of a part of the source electrode 16 or the drain electrode 18.

The contact layer 22 is provided between the oxide semiconductor layer 10 and the barrier layer 20. The contact layer 22 is provided between the first region 10a and the source electrode 16. In addition, the contact layer 22 is provided between the second region 10b and the drain electrode 18.

The contact layer 22 is in contact with the barrier layer 20, for example. The contact layer 22 is in contact with, for example, the oxide semiconductor layer 10. The contact layer 22 is in contact with, for example, the first region 10a. The contact layer 22 is in contact with, for example, the second region 10b.

The contact layer 22 has a function of reducing electric resistance between the first region 10a and the source electrode 16. The contact layer 22 has a function of reducing electric resistance between the second region 10b and the drain electrode 18.

The contact layer 22 contains oxygen (O) and at least one element selected from the group consisting of indium (In), zinc (Zn), tin (Sn), and cadmium (Cd). The contact layer 22 is an oxide.

The contact layer 22 contains, for example, indium (In) and tin (Sn). The contact layer 22 is, for example, an oxide containing indium (In) and tin (Sn).

The thickness of the contact layer 22 is larger than the thickness of the barrier layer 20, for example. The thickness of the contact layer 22 and the thickness of the barrier layer 20 are thicknesses in a direction from the oxide semiconductor layer 10 toward the source electrode 16.

The thickness of the contact layer 22 is, for example, twice or more the thickness of the barrier layer 20. The thickness of the contact layer 22 is, for example, 5 nm or more and 30 nm or less.

The contact layer 22 is, for example, crystalline.

The contact layer 22 is formed by, for example, a sputtering method or an ALD method.

The first insulating layer 24 is provided below the oxide semiconductor layer 10. The first insulating layer 24 is, for example, an oxide, a nitride, or an oxynitride.

The first insulating layer 24 is, for example, silicon oxide, silicon nitride, or silicon oxynitride.

The second insulating layer 26 is provided on the oxide semiconductor layer 10. The second insulating layer 26 is provided between the source electrode 16 and the drain electrode 18.

The second insulating layer 26 electrically separates the source electrode 16 and the drain electrode 18 from each other. The second insulating layer 26 is, for example, an oxide, a nitride, or an oxynitride. The second insulating layer 26 is, for example, silicon oxide, silicon nitride, or silicon oxynitride.

Hereinafter, the function and effect of the semiconductor device of the first embodiment will be described.

For example, when the oxide semiconductor transistor is applied to the switching transistor of the memory cell, the oxide semiconductor transistor undergoes heat treatment accompanying the formation of the memory cell and wiring. Through the heat treatment, the threshold voltage of the oxide semiconductor transistor may fluctuate.

The fluctuation of the threshold voltage of the oxide semiconductor transistor occurs when oxygen in the oxide semiconductor layer in which the channel is formed is released to the source electrode side and drain electrode side. Due to the release of oxygen in the oxide semiconductor layer, oxygen deficiency occurs in the oxide semiconductor layer.

The oxygen deficiency in the oxide semiconductor layer functions as a donor. Therefore, for example, in a case where the oxide semiconductor transistor is an n-channel transistor, when oxygen deficiency occurs, the threshold voltage of the oxide semiconductor transistor decreases.

The transistor 100 of the first embodiment includes a barrier layer 20 that prevents diffusion of oxygen between the oxide semiconductor layer 10 and the source electrode 16 and between the oxide semiconductor layer 10 and the drain electrode 18. By providing the barrier layer 20, oxygen in the oxide semiconductor layer 10 is prevented from being released to the source electrode 16 and the drain electrode 18 side. Hence, the fluctuation of the threshold voltage of the transistor 100 is reduced.

From the viewpoint of preventing the diffusion of oxygen and reducing the electrical resistivity of the barrier layer 20, the barrier layer 20 preferably contains the first metal element being at least one element selected from the group consisting of titanium (Ti), tungsten (W), copper (Cu), aluminum (Al), tantalum (Ta), and molybdenum (Mo) and contains at least one element of oxygen (O) and nitrogen (N). The atomic concentration of the first metal element is the highest among the atomic concentrations of elements except for oxygen (O) and nitrogen (N) contained in the barrier layer 20.

From the viewpoint of preventing the diffusion of oxygen and reducing the electrical resistivity of the barrier layer 20, the barrier layer 20 is preferably titanium oxynitride. The barrier layer 20 preferably contains titanium (Ti), oxygen (O), and nitrogen (N). The first metal element is preferably titanium (Ti).

From the viewpoint of preventing the diffusion of oxygen, the crystal grain size of the barrier layer 20 is preferably small. From the viewpoint of preventing the diffusion of oxygen, the crystal grain size of the barrier layer 20 is preferably smaller than the crystal grain size of the contact layer 22. From the viewpoint of preventing the diffusion of oxygen, the barrier layer 20 is preferably amorphous.

The thickness of the barrier layer 20 is preferably 1 nm or more and 10 nm or less, and more preferably 2 nm or more and 8 nm or less. By the thickness exceeding the above lower limit value, the effect of preventing the diffusion of oxygen is improved. By the thickness falling below the above upper limit value, the resistance of the barrier layer 20 is reduced, and the electric resistance between the source electrode 16 and the oxide semiconductor layer 10 can be reduced. In addition, the electrical resistance between the drain electrode 18 and the oxide semiconductor layer 10 can be reduced.

The transistor 100 of the first embodiment includes a contact layer 22 between the oxide semiconductor layer 10 and the barrier layer 20. By providing the contact layer 22, for example, the contact resistance is reduced as compared with a case where the contact layer 22 is not provided and the barrier layer 20 is in direct contact with the oxide semiconductor layer 10

The contact layer 22 of the transistor 100 is an oxide containing oxygen (O) and at least one element selected from the group consisting of indium (In), zinc (Zn), tin (Sn), and cadmium (Cd). Since the contact layer 22 is an oxide containing oxygen (O) and at least one element selected from the group consisting of indium (In), zinc (Zn), tin (Sn), and cadmium (Cd), it is possible to prevent a high-resistance reactive product from being formed between the oxide semiconductor layer 10 and the contact layer 22 by heat treatment. Hence, the contact resistance between the oxide semiconductor layer 10 and the contact layer 22 can be reduced.

From the viewpoint of reducing the contact resistance between the oxide semiconductor layer 10 and the contact layer 22, the contact layer 22 is preferably an oxide containing indium (In) and tin (Sn).

The thickness of the barrier layer 20 is preferably smaller than the thickness of the contact layer 22. The thickness of the barrier layer 20 is preferably one-half or less of the thickness of the contact layer 22, and more preferably one-third or less.

The thickness of the contact layer 22 is preferably larger than the thickness of the barrier layer 20. The thickness of the contact layer 22 is preferably twice or more, more preferably three times or more the thickness of the barrier layer 20.

The electrical resistivity of the barrier layer 20 is higher than the electrical resistivity of the contact layer 22. By making the thickness of the barrier layer 20 smaller than the thickness of the contact layer 22, in other words, by making the thickness of the contact layer 22 larger than the thickness of the barrier layer 20, for example, the electrical resistance between the source electrode 16 and the oxide semiconductor layer 10 can be reduced. In addition, the electrical resistance between the drain electrode 18 and the oxide semiconductor layer 10 can be reduced.

The thickness of the source electrode 16 is preferably larger than the thickness of the contact layer 22. The thickness of the drain electrode 18 is preferably larger than the thickness of the contact layer 22. The electrical resistivity of the source electrode 16 and the drain electrode 18 is lower than the electrical resistivity of the contact layer 22.

By making the thickness of the source electrode 16 larger than the thickness of the contact layer 22, wiring resistance in the case of using the source electrode 16 as wiring can be reduced. By making the thickness of the drain electrode 18 larger than the thickness of the contact layer 22, wiring resistance in the case of using the drain electrode 18 as wiring can be reduced.

The source electrode 16 or the drain electrode 18 preferably contains at least one second metal element selected from the group consisting of titanium (Ti), tungsten (W), copper (Cu), aluminum (Al), tantalum (Ta), and molybdenum (Mo) from the viewpoint of heat resistance, resistance, and manufacturing. The atomic concentration of the second metal element is the highest among the atomic concentrations of the metal elements contained in the source electrode 16 or the drain electrode 18

The source electrode 16 or the drain electrode 18 more preferably contains titanium (Ti) or tungsten (W) from the viewpoint of heat resistance, resistance, and manufacturing. The second metal element is more preferably titanium (Ti) or tungsten (W). The source electrode 16 or the drain electrode 18 is more preferably titanium nitride or tungsten.

The second metal element contained in the source electrode 16 or the drain electrode 18 is preferably the same as the first metal element contained in the barrier layer 20. By making the second metal element contained in the source electrode 16 or the drain electrode 18 the same as the first metal element contained in the barrier layer 20, the barrier layer 20 can be formed by oxidization, nitriding, or oxynitriding of the source electrode 16 or the drain electrode 18.

The source electrode 16 or the drain electrode 18 is preferably titanium nitride, and the barrier layer 20 is preferably titanium oxynitride. In this case, the first metal element and the second metal element are titanium (Ti). In this case, the barrier layer 20 can be formed by oxidizing the source electrode 16 or the drain electrode 18.

The second metal element contained in the source electrode 16 or the drain electrode 18 is preferably different from the first metal element contained in the barrier layer 20. When the second metal element contained in the source electrode 16 or the drain electrode 18 is a metal element different from the first metal element contained in the barrier layer 20, the source electrode 16 or the drain electrode 18 and the barrier layer 20 can be formed independently.

The source electrode 16 or the drain electrode 18 is preferably tungsten, and the barrier layer 20 is preferably titanium oxynitride. In this case, the first metal element is titanium (Ti), and the second metal element is tungsten (W).

As described above, according to the first embodiment, the fluctuation of the threshold voltage after heat treatment is reduced, and an oxide semiconductor transistor having high heat resistance is realized.

Second Embodiment

A semiconductor device according to a second embodiment is different from the semiconductor device according to the first embodiment in that a gate electrode surrounds an oxide semiconductor layer. Hereinafter, a part of the description of contents overlapping with those of the first embodiment will be omitted.

Figure 2:
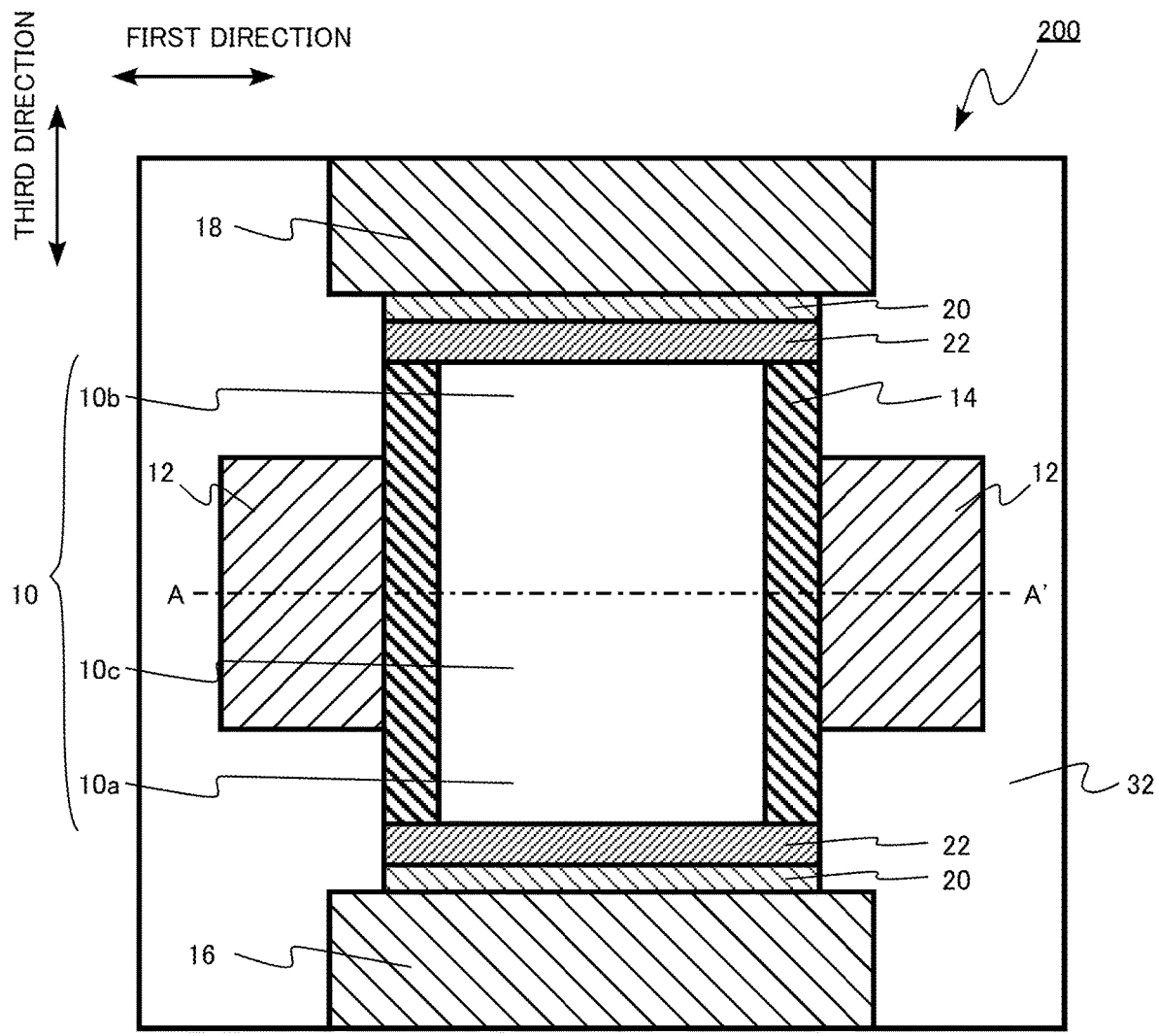
FIG. 2 is a schematic sectional view of a semiconductor device according to a second embodiment.
Figure 3:
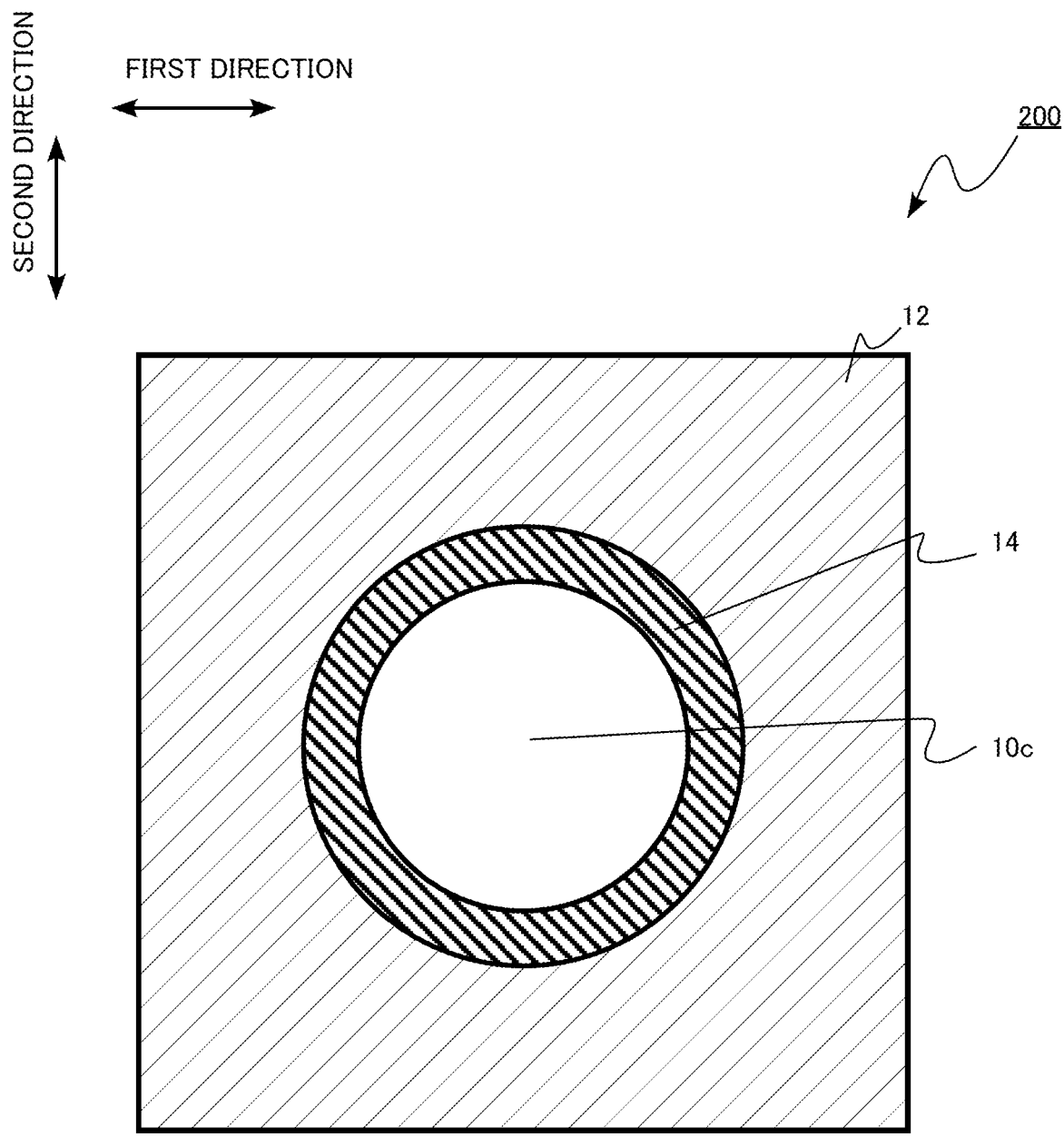
FIG. 3 is a schematic sectional view of the semiconductor device according to the second embodiment.

FIGS. 2 and 3 are schematic sectional views of the semiconductor device of the second embodiment. FIG. 3 is a sectional view taken along line AA' of FIG. 2. In FIG. 2, the horizontal direction is referred to as a first direction, the depth direction is referred to as a second direction, and the vertical direction is referred to as a third direction.

The semiconductor device of the second embodiment is a transistor 200. The transistor 200 is an oxide semiconductor transistor in which a channel is formed in an oxide semiconductor. The transistor 200 is a so-called surrounding gate transistor (SGT) with a gate electrode provided surrounding the oxide semiconductor layer in which the channel is formed. The transistor 200 is a so-called vertical transistor.

The transistor 200 includes an oxide semiconductor layer 10, a gate electrode 12, a gate insulating layer 14, a source electrode 16, a drain electrode 18, a barrier layer 20, a contact layer 22, and an interlayer insulating layer 32. The source electrode 16 is an example of the first electrode. The drain electrode 18 is an example of the second electrode. The barrier layer 20 is an example of the first conductive layer. Contact layer 22 is an example of the second conductive layer.

The oxide semiconductor layer 10 is provided between the source electrode 16 and the drain electrode 18. A channel serving as a current path is formed in the oxide semiconductor layer 10 when the transistor 200 is turned on. The oxide semiconductor layer 10 extends in the third direction. The oxide semiconductor layer 10 has a columnar shape extending in the third direction. The oxide semiconductor layer 10 has, for example, a cylindrical shape.

A direction in which electrons flow in the channel is called a channel length direction. The third direction is the channel length direction of the transistor 200.

The oxide semiconductor layer 10 is an oxide semiconductor. The oxide semiconductor layer 10 is a metal oxide. The oxide semiconductor layer 10 is amorphous, for example.

The oxide semiconductor layer 10 contains, for example, indium (In), zinc (Zn), and at least one element of gallium (Ga) and aluminum (Al). The ratio of the sum of the atomic concentrations of indium, gallium, aluminum, and zinc to the sum of the atomic concentrations of the metal elements contained in the oxide semiconductor layer 10 is, for example, 90% or more. The ratio of the sum of the atomic concentrations of indium, gallium, aluminum, and zinc to the sum of the atomic concentrations of elements except for oxygen contained in the oxide semiconductor layer 10 is, for example, 90% or more. For example, in the oxide semiconductor layer 10, there is no element except for oxygen having an atomic concentration higher than any one of indium, gallium, aluminum, and zinc.

The atomic concentration of zinc (Zn) contained in the oxide semiconductor layer 10 is, for example, 5 atom % or more and 20 atom % or less.

The oxide semiconductor layer 10 has a first region 10a, a second region 10b, and a third region 10c. The third region 10c is provided between the first region 10a and the second region 10b.

The oxide semiconductor layer 10 includes, for example, oxygen deficiency. The oxygen deficiency in the oxide semiconductor layer 10 functions as a donor.

The width of the oxide semiconductor layer 10 in the first direction is, for example, 20 nm or more and 100 nm or less. The length of the oxide semiconductor layer 10 in the third direction is, for example, 80 nm or more and 200 nm or less.

The oxide semiconductor layer 10 is formed by, for example, an ALD method.

The gate electrode 12 is provided surrounding the oxide semiconductor layer 10. The gate electrode 12 is provided around the oxide semiconductor layer 10.

The gate electrode 12 is, for example, a metal, a metal compound, or a semiconductor. The gate electrode 12 is made of, for example, titanium nitride (TiN) or tungsten (W). The gate length of the gate electrode 12 is, for example, 20 nm or more and 100 nm or less. The gate length of the gate electrode 12 is the length of the gate electrode 12 in the third direction.

The gate insulating layer 14 is provided between the oxide semiconductor layer 10 and the gate electrode 12. The gate insulating layer 14 is provided surrounding the oxide semiconductor layer 10. The gate insulating layer 14 is provided between the third region 10c and the gate electrode 12.

The gate insulating layer 14 is, for example, an oxide or oxynitride. The gate insulating layer 14 is, for example, silicon oxide or aluminum oxide. The thickness of the gate insulating layer 14 is, for example, 2 nm or more and 10 nm or less.

An oxide layer (not illustrated) of a material different from that of the gate insulating layer 14 may be provided between the oxide semiconductor layer 10 and the gate insulating layer 14.

The source electrode 16 is provided below the oxide semiconductor layer 10. The source electrode 16 is provided below the first region 10a. The source electrode 16 is electrically connected to the first region 10a.

The source electrode 16 is, for example, a metal or a metal compound. The source electrode 16 is, for example, a metal having a chemical composition different from that of the barrier layer 20.

The source electrode 16 contains, for example, a second metal element. For example, the atomic concentration of the second metal element is the highest among the atomic concentrations of the metal elements contained in the source electrode 16.

The second metal element is, for example, at least one element selected from the group consisting of titanium (Ti), tungsten (W), copper (Cu), aluminum (Al), tantalum (Ta), and molybdenum (Mo).

The source electrode 16 is, for example, titanium, titanium nitride, tungsten, tungsten nitride, copper, aluminum, tantalum, tantalum nitride, molybdenum, or molybdenum nitride.

The second metal element contained in the source electrode 16 is, for example, the same as the first metal element contained in the barrier layer 20. In addition, the second metal element contained in the source electrode 16 is, for example, different from the first metal element contained in the barrier layer 20.

The thickness of the source electrode 16 is larger than the thickness of the contact layer 22, for example. The thickness of the source electrode 16 and the thickness of the contact layer 22 are thicknesses in a direction from the oxide semiconductor layer 10 toward the source electrode 16.

The drain electrode 18 is provided above the oxide semiconductor layer 10. The drain electrode 18 is provided above the second region 10b. The drain electrode 18 is electrically connected to the second region 10b.

The drain electrode 18 contains, for example, a second metal element. For example, the atomic concentration of the second metal element is the highest among the atomic concentrations of the metal elements contained in the drain electrode 18.

The second metal element is, for example, at least one metal element selected from the group consisting of titanium (Ti), tungsten (W), copper (Cu), aluminum (Al), tantalum (Ta), and molybdenum (Mo).

The drain electrode 18 is, for example, titanium, titanium nitride, tungsten, tungsten nitride, copper, aluminum, tantalum, tantalum nitride, molybdenum, or molybdenum nitride.

The second metal element contained in the drain electrode 18 is, for example, the same as the first metal element contained in the barrier layer 20. The second metal element contained in the drain electrode 18 is, for example, different from the first metal element contained in the barrier layer 20.

The thickness of the drain electrode 18 is larger than the thickness of the contact layer 22, for example. The thickness of the drain electrode 18 and the thickness of the contact layer 22 are thicknesses in a direction from the oxide semiconductor layer 10 toward the drain electrode 18.

The barrier layer 20 is provided between the oxide semiconductor layer 10 and the source electrode 16. The barrier layer 20 is provided between the first region 10a and the source electrode 16. The barrier layer 20 is in contact with, for example, the source electrode 16. The barrier layer 20 functions as a diffusion barrier for oxygen diffused from the oxide semiconductor layer 10 toward the source electrode 16.

The barrier layer 20 is provided between the oxide semiconductor layer 10 and the drain electrode 18. The barrier layer 20 is provided between the second region 10b and the drain electrode 18. The barrier layer 20 is in contact with, for example, the drain electrode 18. The barrier layer 20 functions as a diffusion barrier for oxygen diffused from the oxide semiconductor layer 10 toward the drain electrode 18.

The barrier layer 20 contains a first metal element and at least one element of oxygen (O) and nitrogen (N). For example, the atomic concentration of the first metal element is the highest among the atomic concentrations of elements except for oxygen (O) and nitrogen (N) contained in the barrier layer 20.

The first metal element is, for example, at least one element selected from the group consisting of titanium (Ti), tungsten (W), copper (Cu), aluminum (Al), tantalum (Ta), and molybdenum (Mo).

The barrier layer 20 is, for example, an oxide, a nitride, or an oxynitride.

The barrier layer 20 contains, for example, titanium (Ti) as the first metal element. The barrier layer 20 contains, for example, oxygen (O) and nitrogen (N). The barrier layer 20 is, for example, titanium oxide or titanium oxynitride.

The thickness of the barrier layer 20 is, for example, smaller than the thickness of the contact layer 22. The thickness of the barrier layer 20 and the thickness of the contact layer 22 are thicknesses in a direction from the oxide semiconductor layer 10 toward the source electrode 16.

The thickness of the barrier layer 20 is, for example, one-half or less of the thickness of the contact layer 22. The thickness of the barrier layer 20 is, for example, 1 nm or more and 10 nm or less.

The barrier layer 20 is, for example, crystalline. The crystal grain size of the barrier layer 20 is, for example, smaller than the crystal grain size of the contact layer 22. The crystal grain size of the barrier layer 20 and the contact layer 22 is represented by, for example, the median value of the major axis of the crystal grain.

The barrier layer 20 is, for example, amorphous.

The contact layer 22 is provided between the oxide semiconductor layer 10 and the barrier layer 20. The contact layer 22 is provided between the first region 10a and the source electrode 16. In addition, the contact layer 22 is provided between the second region 10b and the drain electrode 18.

The contact layer 22 is in contact with the barrier layer 20, for example. The contact layer 22 is in contact with, for example, the oxide semiconductor layer 10. The contact layer 22 is in contact with, for example, the first region 10a. The contact layer 22 is in contact with, for example, the second region 10b.

The contact layer 22 has a function of reducing resistance between the first region 10a and the source electrode 16. The contact layer 22 has a function of reducing resistance between the second region 10b and the drain electrode 18.

The contact layer 22 contains oxygen (O) and at least one element selected from the group consisting of indium (In), zinc (Zn), tin (Sn), and cadmium (Cd). The contact layer 22 is an oxide.

The contact layer 22 contains, for example, indium (In) and tin (Sn). The contact layer 22 is, for example, an oxide containing indium (In) and tin (Sn).

The thickness of the contact layer 22 is larger than the thickness of the barrier layer 20, for example. The thickness of the contact layer 22 and the thickness of the barrier layer 20 are thicknesses in a direction from the oxide semiconductor layer 10 toward the source electrode 16.

The thickness of the contact layer 22 is, for example, twice or more the thickness of the barrier layer 20. The thickness of the contact layer 22 is, for example, 5 nm or more and 30 nm or less.

The contact layer 22 is, for example, crystalline.

The contact layer 22 is formed by, for example, a sputtering method or an ALD method.

The interlayer insulating layer 32 is provided around the gate electrode 12, the source electrode 16, and the drain electrode 18. The interlayer insulating layer 32 is, for example, an oxide, a nitride, or an oxynitride. The interlayer insulating layer 32 is, for example, silicon oxide, silicon nitride, or silicon oxynitride.

As described above, according to the second embodiment, similarly to the first embodiment, the fluctuation of the threshold voltage after heat treatment is reduced, and an oxide semiconductor transistor having high heat resistance is realized. Further, according to the second embodiment, with the transistor being the SGT, transistors can be disposed at a high density per unit area.

Third Embodiment

A semiconductor memory device of a third embodiment is provided with: a first wiring extending in a first direction; a second wiring extending in a second direction intersecting the first direction; and a memory cell. The memory cell includes an oxide semiconductor layer including a first region, a second region, and a third region provided between the first region and the second region, the first region being electrically connected to the first wiring, the third region being surrounded by a part of the second wiring, a gate insulating layer provided between the third region and the part of the second wiring, a capacitor including a first electrode electrically connected to the second region, a second electrode, and an insulating layer provided between the first electrode and the second electrode, a first conductive layer provided in at least one of positions between the first region and the first wiring or between the second region and the first electrode, and the first conductive layer containing a first metal element and at least one element of oxygen (O) or nitrogen (N), and a second conductive layer provided between the oxide semiconductor layer and the first conductive layer, the second conductive layer containing oxygen (O) and at least one element selected from the group consisting of indium (In), zinc (Zn), tin (Sn), and cadmium (Cd). Hereinafter, a part of the description of contents overlapping with those of the first or second embodiment will be omitted.

The semiconductor memory device of the third embodiment is a semiconductor memory 300. The semiconductor memory device of the third embodiment is a dynamic random-access memory (DRAM). A semiconductor memory 300 uses the transistor 200 of the second embodiment as a switching transistor of a memory cell of the DRAM.

Figure 4:
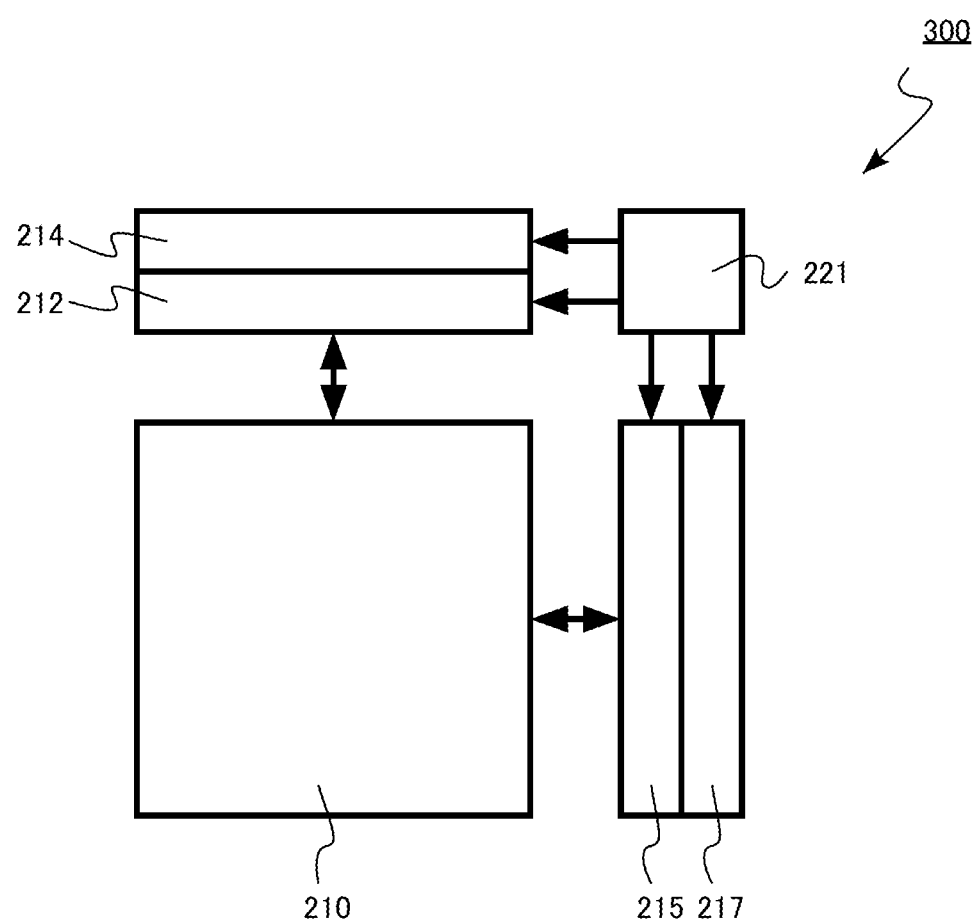
FIG. 4 is a block diagram of a semiconductor memory device according to the third embodiment.

FIG. 4 is a block diagram of the semiconductor memory device according to the third embodiment.

As illustrated in FIG. 4, the semiconductor memory 300 includes a memory cell array 210, a word-line driver circuit 212, a row decoder circuit 214, a sense amplifier circuit 215, a column decoder circuit 217, and a control circuit 221.

Figure 5:
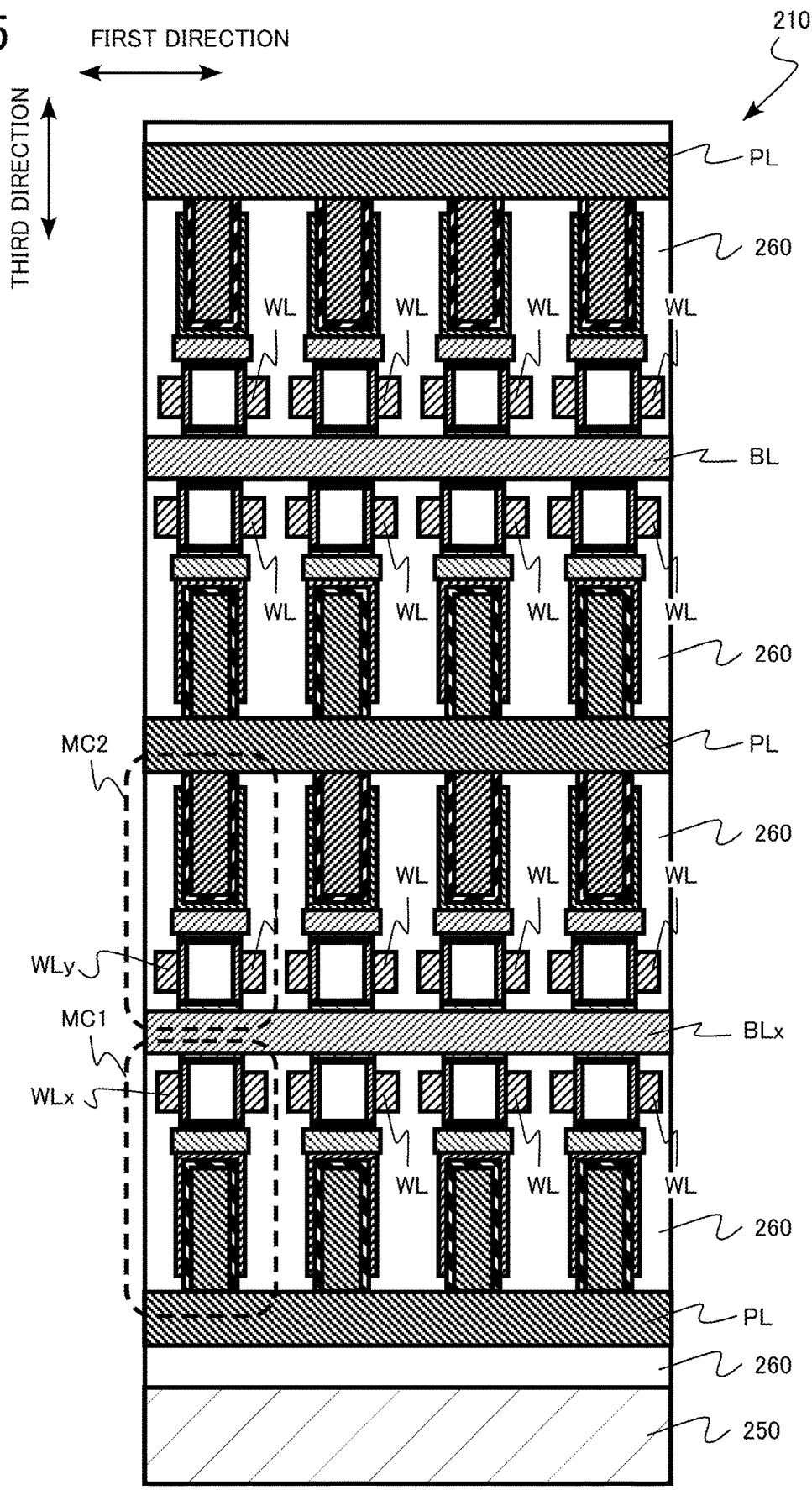
FIG. 5 is a schematic sectional view of a memory cell array of the semiconductor memory device according to the third embodiment.
Figure 6:
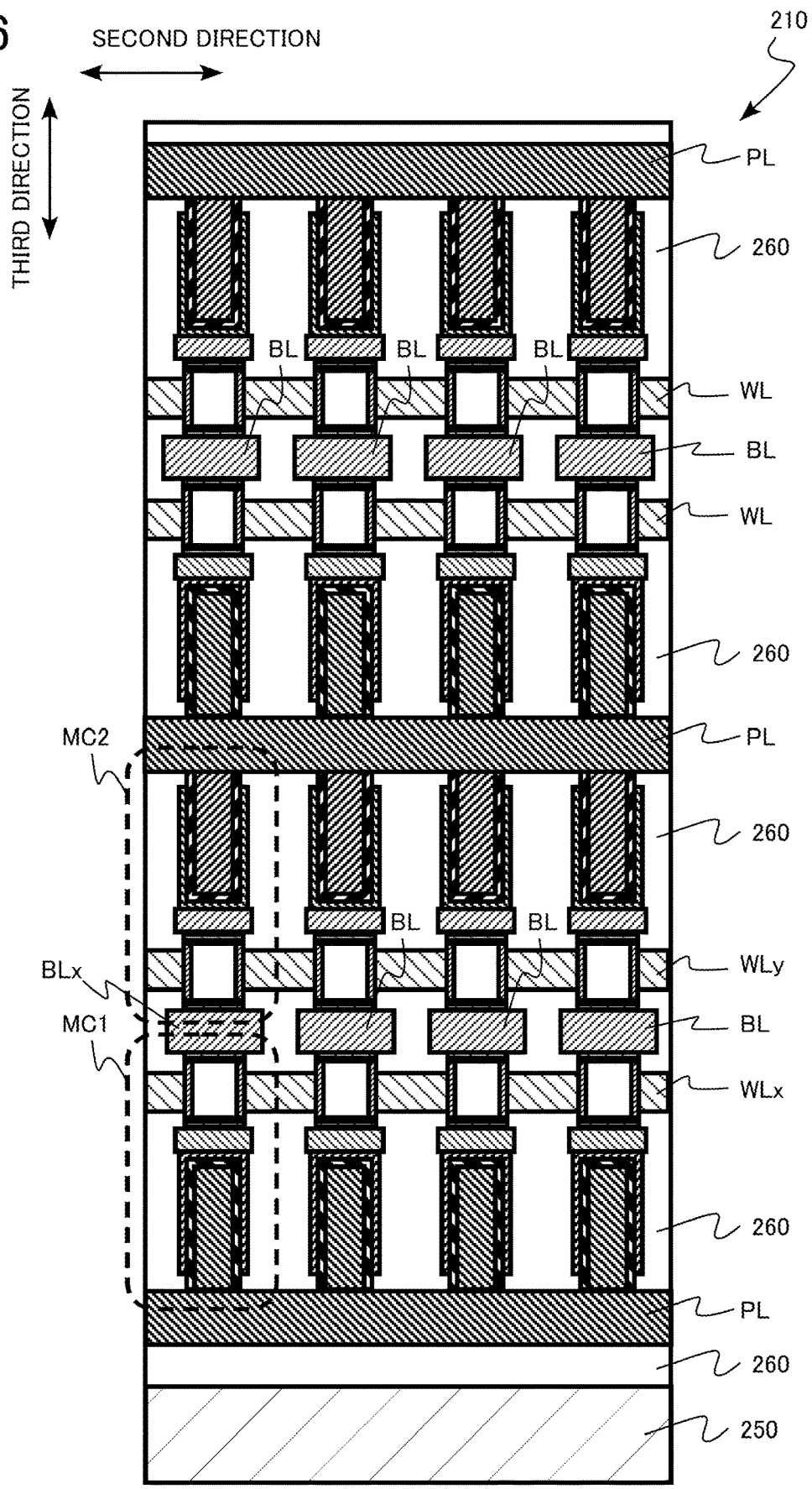
FIG. 6 is a schematic sectional view of the memory cell array of the semiconductor memory device according to the third embodiment.

FIGS. 5 and 6 are schematic sectional views of the memory cell array in the semiconductor memory device of the third embodiment. FIG. 5 is a sectional view of a plane including the first direction and the third direction, and FIG. 6 is a sectional view of a plane including the second direction and the third direction. The first direction and the second direction intersect each other. The first direction and the second direction are, for example, perpendicular to each other. The third direction is a direction perpendicular to the first direction and the second direction. The third direction is, for example, a direction perpendicular to a substrate.

The memory cell array 210 of the third embodiment has a three-dimensional structure in which memory cells are disposed three-dimensionally. In each of FIGS. 5 and 6, a region surrounded by a broken line represents one memory cell.

The memory cell array 210 includes a silicon substrate 250.

The memory cell array 210 includes, for example, a plurality of bit lines BL and a plurality of word lines WL on the silicon substrate 250. The bit line BL extends in the first direction. The word line WL extends in the second direction.

The bit line BL and the word line WL intersect at right angles, for example. The memory cell is disposed in an area where the bit line BL and the word line WL intersect each other. The memory cell includes a first memory cell MC1 and a second memory cell MC2. The first memory cell MC1 and the second memory cell MC2 are examples of the memory cell.

A bit line BL connected to the first memory cell MC1 and the second memory cell MC2 is a bit line BLx. The bit line BLx is an example of the first wiring. A word line WL connected to the first memory cell MC1 is a word line WLx. The word line WLx is an example of the second wiring.

A word line WL connected to the second memory cell MC2 is a word line WLy. The word line WLx is provided on one side of the bit line BLx. The word line WLy is provided on the other side of the bit line BLx.

The memory cell array 210 has a plurality of plate electrode lines PL. The plate electrode line PL is connected to a plate electrode 72 of each memory cell.

The memory cell array 210 includes an interlayer insulating layer 260 for electrical separation of each wiring and each electrode.

The plurality of word lines WL are electrically connected to the row decoder circuit 214. The plurality of bit lines BL are electrically connected to the sense amplifier circuit 215.

The row decoder circuit 214 has a function of selecting a word line WL in accordance with an input row address signal. The word-line driver circuit 212 has a function of applying a predetermined voltage to the word line WL selected by the row decoder circuit 214.

The column decoder circuit 217 has a function of selecting a bit line BL in accordance with an input column address signal. The sense amplifier circuit 215 has a function of applying a predetermined voltage to the bit line BL selected by the column decoder circuit 217. The sense amplifier circuit 215 also has a function of detecting and amplifying the electric potential of the bit line BL.

The control circuit 221 has a function of controlling the word-line driver circuit 212, the row decoder circuit 214, the sense amplifier circuit 215, the column decoder circuit 217, and other circuits (not illustrated).

Circuits such as the word-line driver circuit 212, the row decoder circuit 214, the sense amplifier circuit 215, the column decoder circuit 217, and the control circuit 221 are made of, for example, transistors and wiring layers (not illustrated). The transistor is formed using, for example, the silicon substrate 250.

The bit line BL and the word line WL are, for example, metal. The bit line BL and the word line WL are, for example, titanium nitride, tungsten, or a stacked structure of titanium nitride and tungsten.

Figure 7:
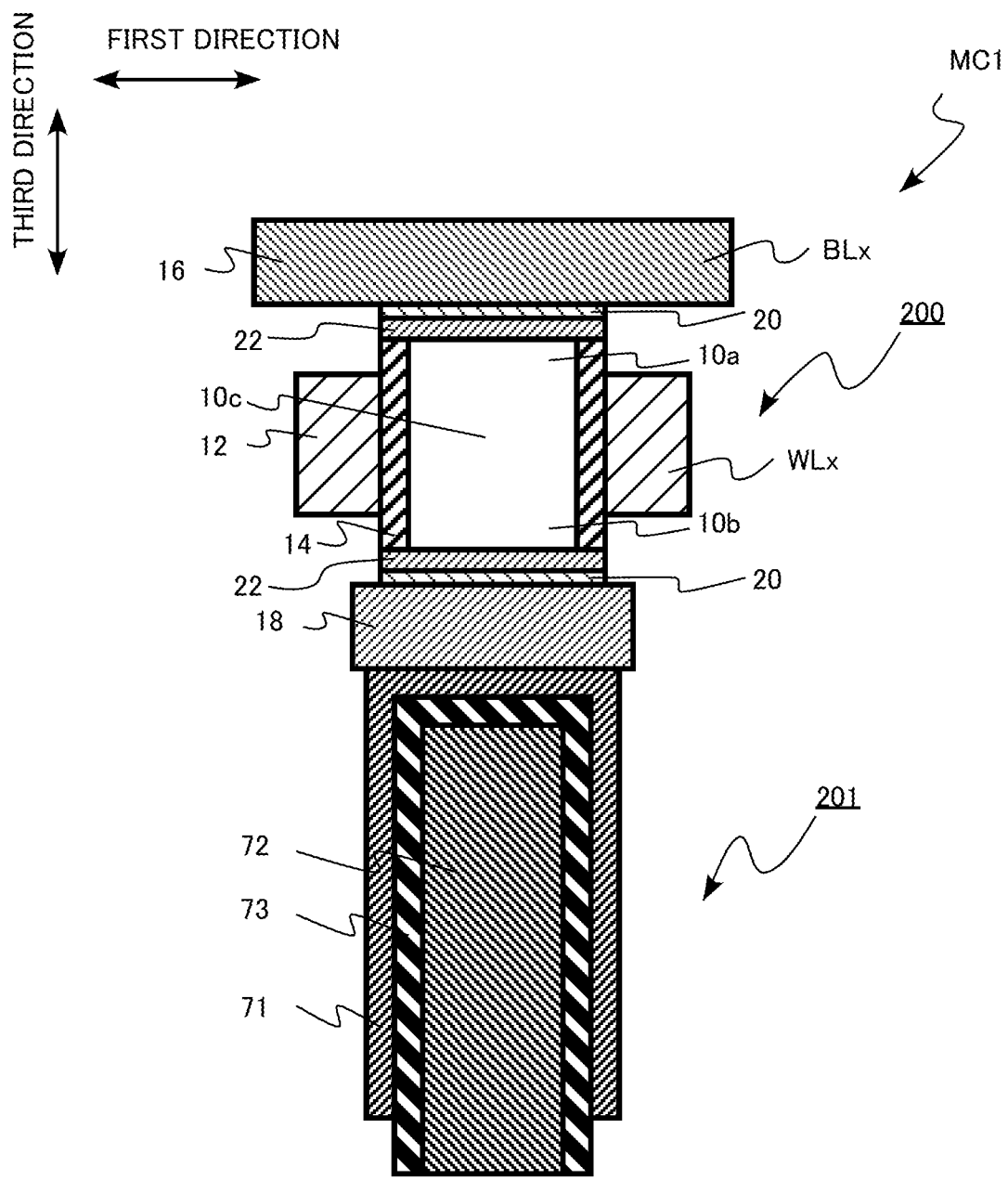
FIG. 7 is a schematic sectional view of a first memory cell of the semiconductor memory device according to the third embodiment.
Figure 8:
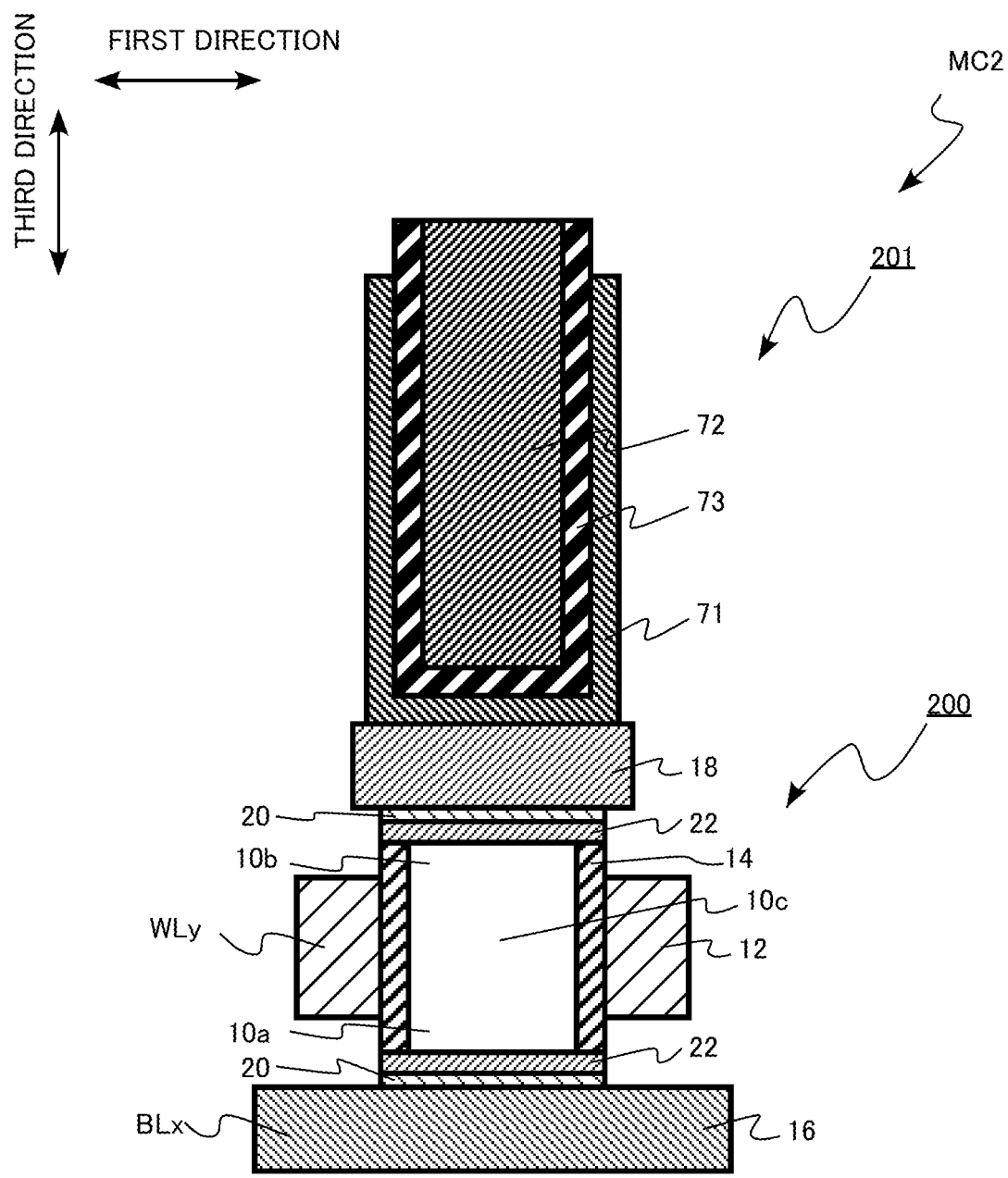
FIG. 8 is a schematic sectional view of a second memory cell of the semiconductor memory device according to the third embodiment.

FIG. 7 is a schematic sectional view of the first memory cell in the semiconductor memory device of the third embodiment. FIG. 8 is a schematic sectional view of the second memory cell in the semiconductor memory device of the third embodiment.

The first memory cell MC1 is provided between the silicon substrate 250 and the bit line BLx. The bit line BLx is provided between the silicon substrate 250 and the second memory cell MC2.

The first memory cell MC1 is provided below the bit line BLx. The second memory cell MC2 is provided above the bit line BLx.

The first memory cell MC1 is provided on one side of the bit line BLx. The second memory cell MC2 is provided on the other side of the bit line BLx.

The second memory cell MC2 has a structure in which the first memory cell MC1 is inverted vertically. The first memory cell MC1 and the second memory cell MC2 each includes the transistor 200 and a capacitor 201.

The transistor 200 includes an oxide semiconductor layer 10, a gate electrode 12, a gate insulating layer 14, a source electrode 16, a drain electrode 18, a barrier layer 20, and a contact layer 22. The barrier layer 20 is an example of the first conductive layer. The contact layer 22 is an example of the second conductive layer. The transistor 200 has the same configuration as the transistor 200 of the second embodiment.

The oxide semiconductor layer 10 has a first region 10a, a second region 10b, and a third region 10c. The third region 10c is provided between the first region 10a and the second region 10b.

The capacitor 201 includes a cell electrode 71, the plate electrode 72, and a capacitor insulating film 73. The cell electrode 71 and the plate electrode 72 are, for example, titanium nitride. The capacitor insulating film 73 has, for example, a stacked structure of zirconium oxide, aluminum oxide, and zirconium oxide.

The cell electrode 71 is an example of the first electrode. The plate electrode 72 is an example of the second electrode. The capacitor insulating film 73 is an example of the insulating layer.

The capacitor 201 is electrically connected to one end of each of the oxide semiconductor layer 10 of the first memory cell MC1 and the second memory cell MC2. The cell electrode 71 of the capacitor 201 is connected to the drain electrode 18. The plate electrode 72 is connected to the plate electrode line PL. The drain electrode 18 can be regarded as a part of cell electrode 71.

The source electrode 16 is connected to the bit line BL. The gate electrode 12 is connected to the word line WL. The source electrode 16 can be regarded as a part of the bit line BL.

FIGS. 5, 6, 7, and 8 each illustrate a case where the bit line BL and the source electrode 16, as well as the word line WL and the gate electrode 12, are simultaneously formed using the same material. The bit line BL and the source electrode 16, as well as the word line WL and the gate electrode 12, may be separately formed using different materials.

The bit line BLx includes, for example, a second metal element. For example, the atomic concentration of the second metal element is the highest among the atomic concentrations of the metal elements contained in the bit line BLx.

The second metal element is, for example, at least one element selected from the group consisting of titanium (Ti), tungsten (W), copper (Cu), aluminum (Al), tantalum (Ta), and molybdenum (Mo).

The bit line BLx is, for example, titanium, titanium nitride, tungsten, tungsten nitride, copper, aluminum, tantalum, tantalum nitride, molybdenum, or molybdenum nitride.

The second metal element contained in the bit line BLx is, for example, the same as the first metal element contained in the barrier layer 20. The second metal element contained in the bit line BLx is, for example, different from the first metal element contained in the barrier layer 20.

The cell electrode 71 contains, for example, a second metal element. For example, the atomic concentration of the second metal element is the highest among the atomic concentrations of the metal elements contained in the cell electrode 71.

The second metal element is, for example, at least one metal element selected from the group consisting of titanium (Ti), tungsten (W), copper (Cu), aluminum (Al), tantalum (Ta), and molybdenum (Mo).

The cell electrode 71 is, for example, titanium, titanium nitride, tungsten, tungsten nitride, copper, aluminum, tantalum, tantalum nitride, molybdenum, or molybdenum nitride.

The second metal element contained in the cell electrode 71 is, for example, the same as the first metal element contained in the barrier layer 20. The second metal element contained in the drain electrode 18 is, for example, different from the first metal element contained in the barrier layer 20.

The bit line BLx is electrically connected to the end (the other end) of the first memory cell MC1 opposite to the end to which the capacitor 201 of the oxide semiconductor layer 10 is connected. The bit line BLx is electrically connected to the end (the other end) of the second memory cell MC2 opposite to the end to which the capacitor 201 of the oxide semiconductor layer 10 is connected.

The word line WLx is electrically connected to the gate electrode 12 of the first memory cell MC1. The word line WLy is electrically connected to the gate electrode 12 of the second memory cell MC2.

The transistor 200 includes a barrier layer 20 between the oxide semiconductor layer 10 and the source electrode 16 and the drain electrode 18. The contact layer 22 is provided between the oxide semiconductor layer 10 and the barrier layer 20.

When the oxide semiconductor transistor is used as the switching transistor of the memory cell of the DRAM, a high-temperature and long-time heat treatment is applied after the formation of the transistor. The heat treatment is, for example, a heat treatment for capacitor formation. By the heat treatment at a high temperature for a long time, the threshold voltage of the oxide semiconductor transistor easily fluctuates.

The transistor 200 includes a barrier layer 20 between the oxide semiconductor layer 10 and the source electrode 16 and the drain electrode 18. Therefore, even when heat treatment at a high temperature for a long time is applied after the transistor is formed, the fluctuation of the threshold voltage is reduced.

Also, the transistor 200 includes the contact layer 22 between the oxide semiconductor layer 10 and the barrier layer 20. Thus, the contact resistance is reduced. This leads to an increase in the on-current of the transistor 200.

The thickness of the bit line BLx is preferably larger than the thickness of the contact layer 22. The thickness of the bit line BLx and the thickness of the contact layer 22 are thicknesses in the third direction.

The electrical resistivity of the bit line BLx is lower than the electrical resistivity of the contact layer 22. The wiring resistance of the bit line BLx can be reduced by making the thickness of the bit line BLx larger than the thickness of the contact layer 22.

The thickness of the cell electrode 71 is preferably larger than the thickness of the contact layer 22. The thickness of the cell electrode 71 and the thickness of the contact layer 22 are thicknesses in the third direction.

According to the third embodiment, by using the transistor 200 of the second embodiment as a switching transistor of a DRAM, the fluctuation of the threshold voltage after heat treatment is reduced, and a semiconductor memory having high heat resistance is realized.

Fourth Embodiment

A semiconductor device according to a fourth embodiment includes: an oxide semiconductor layer; an electrode; a first conductive layer provided between the oxide semiconductor layer and the electrode and containing a first metal element; and a second conductive layer provided between the oxide semiconductor layer and the first conductive layer and containing at least one element of oxygen (O) or nitrogen (N), at least one element selected from the group consisting of indium (In), zinc (Zn), tin (Sn), and cadmium (Cd), and oxygen (O). Hereinafter, a part of the description of contents overlapping with those of the first embodiment will be omitted.

Figure 9:
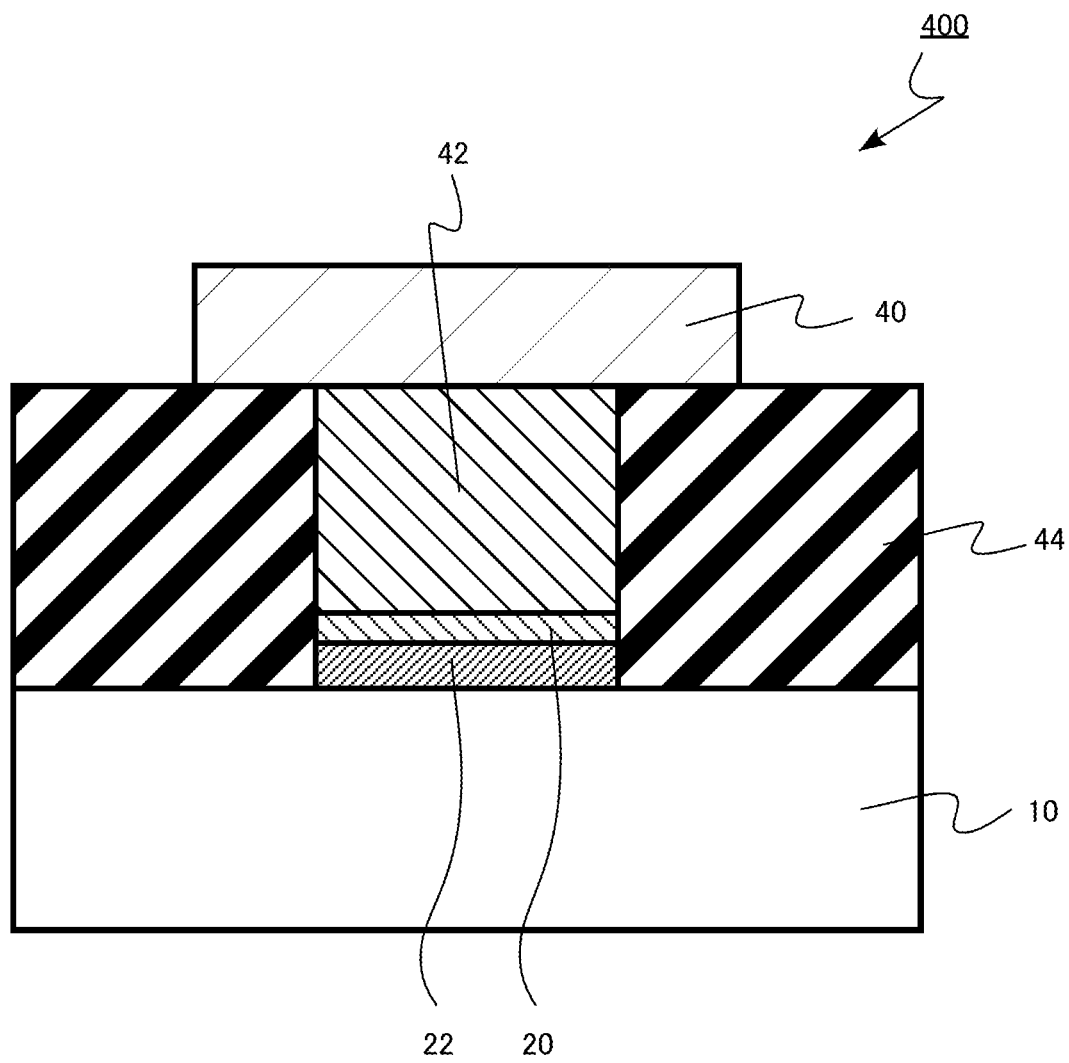
FIG. 9 is a schematic sectional view of a semiconductor device according to a fourth embodiment.

FIG. 9 is a schematic sectional view of the semiconductor device of the fourth embodiment.

The semiconductor device of the fourth embodiment includes a contact structure 400. The contact structure 400 includes an oxide semiconductor layer 10, a barrier layer 20, a contact layer 22, a wiring layer 40, a contact plug 42, and an interlayer insulating layer 44. The barrier layer 20 is an example of the first conductive layer. Contact layer 22 is an example of the second conductive layer. The contact plug 42 is an example of the electrode.

The oxide semiconductor layer 10 is an oxide semiconductor. The oxide semiconductor layer 10 is a metal oxide. The oxide semiconductor layer 10 is amorphous, for example.

The oxide semiconductor layer 10 contains, for example, indium (In), zinc (Zn), and at least one element of gallium (Ga) and aluminum (Al). The ratio of the sum of the atomic concentrations of indium, gallium, aluminum, and zinc to the sum of the atomic concentrations of the metal elements contained in the oxide semiconductor layer 10 is, for example, 90% or more. The ratio of the sum of the atomic concentrations of indium, gallium, aluminum, and zinc to the sum of the atomic concentrations of elements except for oxygen contained in the oxide semiconductor layer 10 is, for example, 90% or more. For example, in the oxide semiconductor layer 10, there is no element except for oxygen having an atomic concentration higher than any one of indium, gallium, aluminum, and zinc.

The wiring layer 40 is, for example, a metal or a metal compound.

The contact plug 42 is provided between the oxide semiconductor layer 10 and the wiring layer 40.

The contact plug 42 is, for example, a metal or a metal compound. The contact plug 42 is, for example, a metal having a chemical composition different from that of the barrier layer 20.

The contact plug 42 contains, for example, a second metal element. For example, the atomic concentration of the second metal element is the highest among the atomic concentrations of the metal elements contained in the contact plug 42.

The second metal element is, for example, at least one element selected from the group consisting of titanium (Ti), tungsten (W), copper (Cu), aluminum (Al), tantalum (Ta), and molybdenum (Mo).

The contact plug 42 is, for example, titanium, titanium nitride, tungsten, tungsten nitride, copper, aluminum, tantalum, tantalum nitride, molybdenum, or molybdenum nitride.

The second metal element contained in the contact plug 42 is, for example, the same as the first metal element contained in the barrier layer 20. The second metal element included in the contact plug 42 is, for example, different from the first metal element included in the barrier layer 20.

The thickness of the contact plug 42 is larger than the thickness of the contact plug 42, for example. The thickness of the contact plug 42 and the thickness of the contact layer 22 are thicknesses in a direction from the oxide semiconductor layer 10 toward the contact plug 42.

The barrier layer 20 is provided between the oxide semiconductor layer 10 and the contact plug 42. The barrier layer 20 is in contact with, for example, the contact plug 42. The barrier layer 20 functions as a diffusion barrier for oxygen diffused from the oxide semiconductor layer 10 toward the contact plug 42.

The barrier layer 20 contains a first metal element and at least one element of oxygen (O) and nitrogen (N). For example, the atomic concentration of the first metal element is the highest among the atomic concentrations of elements except for oxygen (O) and nitrogen (N) contained in the barrier layer 20.

The first metal element is, for example, at least one metal element selected from the group consisting of titanium (Ti), tungsten (W), copper (Cu), aluminum (Al), tantalum (Ta), and molybdenum (Mo).

The barrier layer 20 is, for example, an oxide, a nitride, or an oxynitride.

The barrier layer 20 contains, for example, titanium (Ti) as the first metal element. The barrier layer 20 contains, for example, oxygen (O) and nitrogen (N). The barrier layer 20 is made of titanium oxide or titanium oxynitride.

The thickness of the barrier layer 20 is, for example, smaller than the thickness of the contact layer 22. The thickness of the barrier layer 20 and the thickness of the contact layer 22 are thicknesses in a direction from the oxide semiconductor layer 10 toward the contact plug 42.

The thickness of the barrier layer 20 is, for example, one-half or less of the thickness of the contact layer 22. The thickness of the barrier layer 20 is, for example, 1 nm or more and 10 nm or less.

The barrier layer 20 is, for example, crystalline. The crystal grain size of the barrier layer 20 is, for example, smaller than the crystal grain size of the contact layer 22. The crystal grain size of the barrier layer 20 and the contact layer 22 is represented by, for example, the median value of the major axis of the crystal grain.

The barrier layer 20 is, for example, amorphous.

The barrier layer 20 is formed by, for example, a sputtering method or an ALD method. The barrier layer 20 is formed by, for example, oxidization, nitriding, or oxynitriding of a part of the contact plug 42.

The contact layer 22 is provided between the oxide semiconductor layer 10 and the barrier layer 20. The contact layer 22 is in contact with the barrier layer 20, for example. The contact layer 22 is in contact with, for example, the oxide semiconductor layer 10.

The contact layer 22 has a function of reducing electric resistance between the oxide semiconductor layer 10 and the contact plug 42.

The contact layer 22 contains oxygen (O) and at least one element selected from the group consisting of indium (In), zinc (Zn), tin (Sn), and cadmium (Cd). The contact layer 22 is an oxide.

The contact layer 22 contains, for example, indium (In) and tin (Sn). The contact layer 22 is, for example, an oxide containing indium (In) and tin (Sn).

The thickness of the contact layer 22 is larger than the thickness of the barrier layer 20, for example. The thickness of the contact layer 22 and the thickness of the barrier layer 20 are thicknesses in a direction from the oxide semiconductor layer 10 toward the contact plug 42.

The thickness of the contact layer 22 is, for example, twice or more the thickness of the barrier layer 20. The thickness of the contact layer 22 is, for example, 5 nm or more and 30 nm or less.

The contact layer 22 is, for example, crystalline.

The contact layer 22 is formed by, for example, a sputtering method or an ALD method.

The interlayer insulating layer 44 is provided between the oxide semiconductor layer 10 and the wiring layer 40. The interlayer insulating layer 44 is, for example, silicon oxide, silicon nitride, or silicon oxynitride.

When the contact structure 400 does not include the barrier layer 20, oxygen in the oxide semiconductor layer is released to the contact plug 42 side by heat treatment applied after the contact structure 400 is formed. Due to the release of oxygen in the oxide semiconductor layer, oxygen deficiency occurs in the oxide semiconductor layer. The oxygen deficiency in the oxide semiconductor layer functions as a donor.

When the concentration of the donor in the oxide semiconductor layer 10 under the contact plug 42 changes, the contact resistance between the oxide semiconductor layer 10 and the contact plug 42 fluctuates. The contact resistance between the oxide semiconductor layer 10 and the contact plug 42 becomes unstable.

The contact structure 400 includes a barrier layer 20 between the oxide semiconductor layer 10 and the contact plug 42. By providing the barrier layer 20, a change in the concentration of donors in the oxide semiconductor layer 10 is reduced. Therefore, the contact resistance between the oxide semiconductor layer 10 and the contact plug 42 is stabilized.

Also, the contact structure 400 includes a contact layer 22 between the oxide semiconductor layer 10 and the barrier layer 20. Therefore, the contact resistance between the oxide semiconductor layer 10 and the contact plug 42 is reduced.

As described above, according to the fourth embodiment, the fluctuation of the contact resistance after the heat treatment is reduced, and a semiconductor device having high heat resistance is realized.

In the first to fourth embodiments, the transistor has been described as an example, the transistor having the barrier layer 20 and the contact layer 22 provided at both positions between the first region 10a and the source electrode 16 and between the second region 10b and the drain electrode 18. However, the transistor may be a transistor having the barrier layer 20 and the contact layer 22 provided only at one of the positions between the first region 10a and the source electrode 16 and between the second region 10b and the drain electrode 18.

In the first to fourth embodiments, the case where the oxide semiconductor layer 10 is a metal oxide containing indium (In), zinc (Zn), and at least one element of gallium (Ga) and aluminum (Al) has been described as an example, but other metal oxides can also be applied to the oxide semiconductor layer 10.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    an oxide semiconductor layer including a first region, a second region, and a third region provided between the first region and the second region;
    a gate electrode;
    a gate insulating layer provided between the third region and the gate electrode;
    a first electrode electrically connected to the first region;
    a second electrode electrically connected to the second region;
    a first conductive layer provided in at least one of positions between the first region and the first electrode or between the second region and the second electrode, and the first conductive layer containing a first metal element and at least one element of oxygen (O) or nitrogen (N); and
    a second conductive layer provided between the oxide semiconductor layer and the first conductive layer, the second conductive layer containing oxygen (O) and at least one element selected from the group consisting of indium (In), zinc (Zn), tin (Sn), and cadmium (Cd), and the second conductive layer having a thickness in a first direction from the first conductive layer to the second conductive layer, which is larger than a thickness in the first direction of the first conductive layer,
    wherein the first metal element is at least one element selected from the group consisting of titanium (Ti), tungsten (W), copper (Cu), aluminum (Al), tantalum (Ta), and molybdenum (Mo).

2. The semiconductor device according to claim 1, wherein a thickness in the first direction of the first electrode having the first conductive layer provided between the first electrode and the oxide semiconductor layer, or a thickness in the first direction of the second electrode having the first conductive layer provided between the second electrode and the oxide semiconductor layer, is larger than the thickness of the second conductive layer.

3. The semiconductor device according to claim 1, wherein the thickness of the first conductive layer is 1 nm or more and 10 nm or less.

4. The semiconductor device according to claim 1, wherein an atomic concentration of the first metal element is the highest among atomic concentrations of elements except for oxygen (O) and nitrogen (N) contained in the first conductive layer.

5. The semiconductor device according to claim 1, wherein
    at least one of the first electrode having the first conductive layer provided between the first electrode and the oxide semiconductor layer, or the second electrode having the first conductive layer provided between the second electrode and the oxide semiconductor layer, contains a second metal element,
    an atomic concentration of the second metal element is the highest among atomic concentrations of metal elements contained in the at least one of the first electrode or the second electrode, and
    the second metal element is the same as the first metal element.

6. The semiconductor device according to claim 1, wherein
    at least one of the first electrode having the first conductive layer provided between the first electrode and the oxide semiconductor layer, or the second electrode having the first conductive layer provided between the second electrode and the oxide semiconductor layer, contains a second metal element,
    an atomic concentration of the second metal element is the highest among atomic concentrations of metal elements contained in the at least one of the first electrode or the second electrode, and
    the second metal element is different from the first metal element.

7. The semiconductor device according to claim 1, wherein the first conductive layer contains oxygen (O) and nitrogen (N), and the first metal element is titanium (Ti).

8. The semiconductor device according to claim 1, wherein the oxide semiconductor layer contains indium (In), zinc (Zn), and at least one element of gallium (Ga) or aluminum (Al).

9. The semiconductor device according to claim 1, wherein the gate electrode surrounds the oxide semiconductor layer.

10. A semiconductor device comprising:
an oxide semiconductor layer including a first region, a second region, and a third region provided between the first region and the second region;
a gate electrode;
a gate insulating layer provided between the third region and the gate electrode;
a first electrode electrically connected to the first region;
a second electrode electrically connected to the second region;
a first conductive layer provided in at least one of positions between the first region and the first electrode or between the second region and the second electrode, the first conductive layer containing at least one first metal element selected from the group consisting of titanium (Ti), tungsten (W), copper (Cu), aluminum (Al), tantalum (Ta), and molybdenum (Mo), the first conductive layer containing at least one element of oxygen (O) or nitrogen (N), and the at least one first metal element having the highest atomic concentration among atomic concentrations of elements except for oxygen (O) and nitrogen (N) contained in the first conductive layer; and
a second conductive layer provided between the oxide semiconductor layer and the first conductive layer, and the second conductive layer containing oxygen (O) and at least one element selected from the group consisting of indium (In), zinc (Zn), tin (Sn), and cadmium (Cd).

11. A semiconductor device comprising:
an oxide semiconductor layer including a first region, a second region, and a third region provide between the first region and the second region;
a gate electrode;
a gate insulating layer provided between the third region and the gate electrode;
a first electrode electrically connected to the first region;
a second electrode electrically connected to the second region;
a first conductive layer provided at least one of positions between the first region and the first electrode or between the second region and the second electrode, and the first conductive layer containing a first metal element and at least one element of oxygen (O) or nitrogen (N); and
a second conductive layer provided between the oxide semiconductor layer and the first conductive layer, and the second conductive layer containing oxygen (O) and at least one element selected from the group consisting of indium (In), zinc (Zn), tin (Sn), and cadmium (Cd), wherein
at least one of the first electrode having the first conductive layer provided between the first electrode and the oxide semiconductor layer, or the second electrode having the first conductive layer provided between the second electrode and the oxide semiconductor layer, contains a second metal element, an atomic concentration of the second metal element is the highest among atomic concentrations of metal elements contained in the at least one of the first electrode or the second electrode,
the second metal element is the same as the first metal element, and
the first metal element is at least one element selected from the group consisting of titanium (Ti), tungsten (W), copper (Cu), aluminum (Al), tantalum (Ta), and molybdenum (Mo).

12. A semiconductor memory device comprising:
a first wiring extending in a first direction;
a second wiring extending in a second direction intersecting the first direction; and
a memory cell,
wherein
the memory cell includes
an oxide semiconductor layer including a first region, a second region, and a third region provided between the first region and the second region, the first region being electrically connected to the first wiring, the third region being surrounded by a part of the second wiring,
a gate insulating layer provided between the third region and the part of the second wiring,
a capacitor including a first electrode electrically connected to the second region, a second electrode, and an insulating layer provided between the first electrode and the second electrode,
a first conductive layer provided in at least one of positions between the first region and the first wiring or between the second region and the first electrode, and the first conductive layer containing a first metal element and at least one element of oxygen (O) or nitrogen (N), and
a second conductive layer provided between the oxide semiconductor layer and the first conductive layer, the second conductive layer containing oxygen (O) and at least one element selected from the group consisting of indium (In), zinc (Zn), tin (Sn), and cadmium (Cd), and the second conductive layer having a thickness in a third direction from the first conductive layer to the second conductive layer, which is larger than a thickness in the third direction of the first conductive layer,
wherein the first metal element is at least one element selected from the group consisting of titanium (Ti), tungsten (W), copper (Cu), aluminum (Al), tantalum (Ta), and molybdenum (Mo).

13. The semiconductor memory device according to claim 12, wherein a thickness in the third direction of the first wiring having the first conductive layer provided between the first wiring and the oxide semiconductor layer, or a thickness in the third direction of the first electrode having the first conductive layer provided between the first electrode and the oxide semiconductor layer, is larger than the thickness of the second conductive layer.

14. The semiconductor memory device according to claim 12, wherein the thickness of the first conductive layer is 1 nm or more and 10 nm or less.

15. The semiconductor memory device according to claim 12, wherein an atomic concentration of the first metal element is the highest among atomic concentrations of elements except for oxygen (O) and nitrogen (N) contained in the first conductive layer.

16. The semiconductor memory device according to claim 12, wherein
at least one of the first wiring having the first conductive layer provided between the first wiring and the oxide semiconductor layer, or the first electrode having the first conductive layer provided between the first electrode and the oxide semiconductor layer, contains a second metal element, an atomic concentration of the second metal element is the highest among atomic concentrations of metal elements contained in the at least one of the first wiring or the first electrode, and the second metal element is the same as the first metal element.

17. The semiconductor memory device according to claim 12, wherein at least one of the first wiring having the first conductive layer provided between the first wiring and the oxide semiconductor layer, or the first electrode having the first conductive layer provided between the first electrode and the oxide semiconductor layer, contains a second metal element, an atomic concentration of the second metal element is the highest among atomic concentrations of metal elements contained in the at least one of the first wiring or the first electrode, and the second metal element is different from the first metal element.

18. The semiconductor memory device according to claim 12, wherein the first conductive layer contains oxygen (O) and nitrogen (N), and the first metal element is titanium (Ti).

19. The semiconductor memory device according to claim 12, wherein the oxide semiconductor layer contains indium (In), zinc (Zn), and at least one element of gallium (Ga) or aluminum (Al).

20. A semiconductor memory device comprising:
a first wiring extending in a first direction;
a second wiring extending in a second direction intersecting the first direction; and
a memory cell,
wherein
the memory cell includes
an oxide semiconductor layer including a first region, a second region, and a third region provided between the first region and the second region, the first region being electrically connected to the first wiring, the third region being surrounded by a part of the second wiring,
a gate insulating layer provided between the third region and the part of the second wiring,
a capacitor electrically connected to the second region;
a first conductive layer provided in at least one of positions between the first region and the first wiring or between the second region and the capacitor, the first conductive layer containing at least one first metal element selected from the group consisting of titanium (Ti), tungsten (W), copper (Cu), aluminum (Al), tantalum (Ta), and molybdenum (Mo), the first conductive layer containing at least one element of oxygen (O) or nitrogen (N), and the at least one first metal element having the highest atomic concentration among atomic concentrations of elements except for oxygen (O) and nitrogen (N) contained in the first conductive layer; and
a second conductive layer provided between the oxide semiconductor layer and the first conductive layer, and the second conductive layer containing oxygen (O) and at least one element selected from the group consisting of indium (In), zinc (Zn), tin (Sn), and cadmium (Cd).

21. A semiconductor memory device comprising:
a first wiring extending in a first direction;
a second wiring extending in a second direction intersecting the first direction; and
a memory cell,
wherein
the memory cell includes
an oxide semiconductor layer including a first region, a second region, and a third region provided between the first region and the second region, the first region being electrically connected to the first wiring, the third region being surrounded by a part of the second wiring,
a gate insulating layer provided between the third region and the part of the second wiring,
a capacitor including a first electrode electrically connected to the second region, a second electrode, and an insulating layer provided between the first electrode and the second electrode,
a first conductive layer provided in at least one of positions between the first region and the first wiring or between the second region and the first electrode, and the first conductive layer containing a first metal element and at least one element of oxygen (O) or nitrogen (N), and
a second conductive layer provided between the oxide semiconductor layer and the first conductive layer, and the second conductive layer containing oxygen (O) and at least one element selected from the group consisting of indium (In), zinc (Zn), tin (Sn), and cadmium (Cd), wherein
at least one of the first wiring having the first conductive layer provided between the first wiring and the oxide semiconductor layer, or the first electrode having the first conductive layer provided between the first electrode and the oxide semiconductor layer, contains a second metal element,
an atomic concentration of the second metal element is the highest among atomic concentrations of metal elements contained in the at least one of the first wiring or the first electrode,
the second metal element is the same as the first metal element, and
the first metal element is at least one element selected from the group consisting of titanium (Ti), tungsten (W), copper (Cu), aluminum (Al), tantalum (Ta), and molybdenum (Mo).

* * * * *